(12) United States Patent
Brand (10) Patent No.: US 6,355,985 B1
(45) Date of Patent: Mar. 12, 2002

(54) INTEGRATED CIRCUIT DEVICE AND SYNCHRONOUS-LINK DYNAMIC RANDOM ACCESS MEMORY DEVICE

(75) Inventor: Joseph M. Brand, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/228,705

(22) Filed: Jan. 12, 1999

Related U.S. Application Data (62) Division of application No. 09/164,605, filed on Oct. 1, 1998, now Pat. No. 6,008,074.

(51) Int. Cl.[7] .................. H01L 23/29; H01L 23/28; H01L 23/45; H01L 23/36; G11C 7/00
(52) U.S. Cl. .................. 257/790; 257/707; 257/706; 257/685; 257/723; 257/687; 257/788; 257/787; 257/796; 257/684; 257/646; 257/675; 257/712; 257/905; 365/230.03; 365/230.06; 365/233; 365/194; 365/203; 711/167; 361/704
(58) Field of Search .................. 257/706, 712, 257/787, 791, 717, 720, 675, 666, 676, 790, 905–909, 723, 685, 684, 713, 796; 365/203, 230.03, 230.06, 233, 194; 711/167; 361/704

(56) References Cited

U.S. PATENT DOCUMENTS

| | | | |
|---|---|---|---|
| 5,057,457 A | 10/1991 | Miyahara et al. | |
| 5,249,101 A | 9/1993 | Frey et al. | 257/738 |
| 5,331,205 A | 7/1994 | Primeaux | 257/790 |
| 5,352,851 A | 10/1994 | Wallace et al. | 361/764 |
| 5,379,186 A | 1/1995 | Gold et al. | 257/790 |
| 5,406,117 A * | 4/1995 | Dlugockecki et al. | 257/790 |
| 5,698,899 A | 12/1997 | Hirakawa et al. | 257/712 |
| 5,789,813 A * | 8/1998 | Kirkland et al. | 257/790 |
| 5,847,467 A | 12/1998 | Wills et al. | 257/790 |
| 5,864,175 A * | 1/1999 | Burns | 257/790 |
| 5,946,556 A * | 8/1999 | Hashiznme | 438/126 |
| 6,104,093 A * | 8/2000 | Coletka et al. | 257/778 |
| 6,144,107 A * | 11/2000 | Narita | 257/790 |

FOREIGN PATENT DOCUMENTS

| | | | | |
|---|---|---|---|---|
| JP | 57-133653 | * | 8/1982 | 257/790 |
| JP | 63-141353 | * | 6/1988 | 257/790 |

OTHER PUBLICATIONS

IEEE 100 The Authoritatve Dictionary of IEEE Standards Terms–Seventh Edition (2000) p. 510.
Pecht, Michael, editor; "Handbook of Electronic Package Design"; p. 95–97, 219–220.
Seraphim, Donald P., editor; "Principles of electronics Packaging"; p. 130–131, 600.
How to Make IC Package, Internet Web pages from www.msato@iis.u0tokyo.ac.jp web site, Aug. 31, 1998, 10 pages.
SLD4M18DR400 4 Meg × 18 SLDRAM, Internet Web pages from www.sldram.com web site, 1998, 12 pages.

\* cited by examiner

*Primary Examiner*—Alexander O. Williams
(74) *Attorney, Agent, or Firm*—Wells, St. John, Roberts, Gregory & Matkin, P.S.

(57) ABSTRACT

The present invention includes integrated circuit devices, synchronous-link dynamic random access memory devices, methods of forming an integrated circuit device and methods of forming a synchronous-link dynamic random access memory edge-mounted device. According to one aspect of the present invention, an integrated circuit device includes a semiconductor die and a first housing encapsulating the semiconductor die. A heat sink is positioned proximate the first housing and a second housing is formed to encapsulate at least a portion of the heat sink. The heat sink is preferably thermally coupled with the semiconductor die and configured to expel heat therefrom. Another aspect provides a method of forming an integrated circuit device including the steps of providing a semiconductor die; forming a first housing about the semiconductor die; thermally coupling a heat sink with the first housing; and forming a second housing about at least a portion of the heat sink following the thermally coupling.

39 Claims, 5 Drawing Sheets

INTEGRATED CIRCUIT DEVICE AND SYNCHRONOUS-LINK DYNAMIC RANDOM ACCESS MEMORY DEVICE

RELATED PATENT DATA

This patent resulted from a divisional application of U.S. patent application Ser. No. 09/164,605, filed Oct. 1, 1998, entitled "Integrated Circuit Device, Synchronous-Link Dynamic Random Access Memory Device, Method of Forming an Integrated Circuit Device and Method of Forming a Synchronous-Link Dynamic Random Access Memory Edge-Mounted Device", naming Joseph M. Brand as inventor, and which is now U.S. Pat. No. 6,008,074 the disclosure of which is incorporated by reference.

TECHNICAL FIELD

The present invention relates to integrated circuit devices, synchronous-link dynamic random access memory devices, methods of forming an integrated circuit device and methods of forming a synchronous-link dynamic random access memory edge-mounted device.

BACKGROUND OF THE INVENTION

Personal computers have experienced expansive growth and improvements in technology in recent decades. Improvements in processing technologies have enabled fabrication of computer components having reduced feature sizes. Such reduction in feature sizes has also enabled the fabrication of smaller components with increased capabilities.

For example, both the operational speeds of processing devices and the capacity to store data of memory devices have been significantly increased. However, there exists a desire to increase the storage capacity of conventional memory devices. Data is stored in components comprising random access memory (RAM) in some conventional configurations. Exemplary random access memory devices include static random access memory (SRAM) and dynamic random access memory (DRAM). It has been desired to increase the speed of memory devices to increase the overall performance of the conventional computer systems.

Synchronous-link dynamic random access memory (SLDRAM) devices have been introduced to provide faster electronic storage devices. The synchronous-link dynamic random access memory devices provide benefits of very high speed (e.g., 400 megahertz data rate) and very high bandwidth (e.g., 800 Mb/s I/O bandwidth). In addition, such storage devices can provide pipelined or concurrent operation. Exemplary synchronous-link dynamic random access memory devices provide synchronous and packet oriented operation with storage capabilities in excess of 75 MB.

Various packaging configurations have been utilized as housings for conventional synchronous-link dynamic random access memory devices. Exemplary configurations include vertical surface mounted packages (VSMP) and horizontal surface mounted packages (HSMP). In typical configurations, the leads extend from one surface of the mounted packages and are bent and trimmed for the desired orientation.

It has been observed that conventional synchronous-link dynamic random access memory devices produce a considerable amount of heat. Accordingly, various structures have been utilized to reduce or dissipate the generated heat. One prior art technique has considered the utilization of a heat sink bonded to an external wall of a package which houses the synchronous-link dynamic random access memory semiconductor die. In such conventional designs, an epoxy or other adhesive is typically utilized to bond or otherwise adhere the heat sink to the external surface of the housing package. Drawbacks are presented by the conventional designs inasmuch as subsequent processing of an individual synchronous-link dynamic random access memory device often results in heating the memory device to the point of failure of the epoxy heat sink bond.

Therefore, there exists a need to provide improved memory configurations to overcome the shortcomings experienced within the prior art devices.

SUMMARY OF THE INVENTION

The present invention includes integrated circuit devices, synchronous-link dynamic random access memory devices, methods of forming an integrated circuit device and methods of forming a synchronous-link dynamic random access memory edge-mounted device.

According to one aspect of the present invention, an integrated circuit device includes a semiconductor die and a first housing encapsulating the semiconductor die. A heat sink is positioned proximate the first housing. A second housing is formed to encapsulate at least a portion of the heat sink. The heat sink is preferably thermally coupled with the semiconductor die and configured to dissipate or expel heat therefrom. The second housing is configured to encapsulate both the heat sink and the first housing in certain aspects of the invention.

Another aspect of the present invention provides an integrated circuit device which includes a first housing formed about a semiconductor die and at least portions of a plurality of leads electrically coupled with the semiconductor die. A heat sink is thermally coupled with the first housing. A second housing is formed about the heat sink and at least a portion of the first housing.

The present invention additionally provides methods of forming an integrated circuit device. One aspect provides a method including the steps of providing a semiconductor die and forming a first housing about the semiconductor die. The method also includes thermally coupling a heat sink with the first housing and forming a second housing about at least a portion of the heat sink following the thermally coupling.

The present invention also provides additional structure and methodology aspects.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
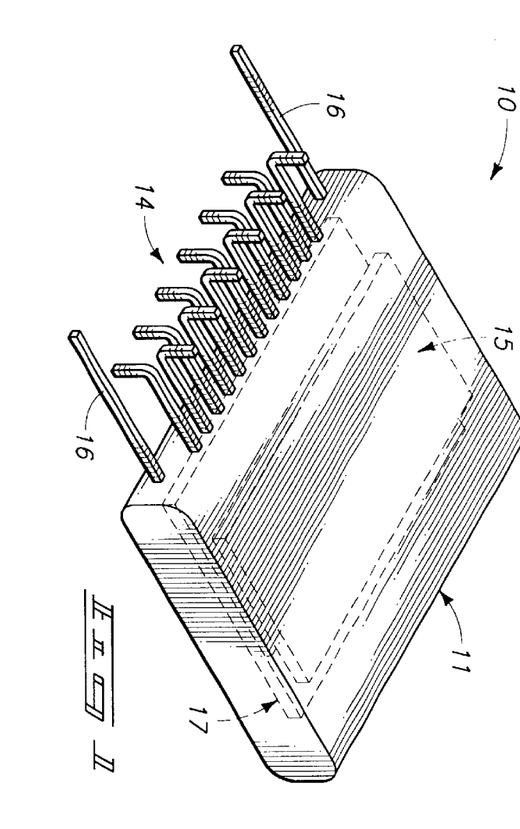
FIG. 1 is an isometric view of a vertical surface mounted package in accordance with the present invention.

Referring to FIG. 1, an integrated circuit device 10 according to the present invention is illustrated. The described embodiment discloses a synchronous-link dynamic random access memory (SLDRAM) edge-mounted device. The depicted integrated circuit device 10 comprises a vertical surface mounted package (VSMP). A horizontal surface mounted package (HSMP) is also provided in other embodiments. The embodiments depicted herein are exemplary. The present invention is not limited to such disclosed arrangements but can be utilized with other integrated circuit device configurations.

The illustrated integrated circuit device 10 includes a housing 11 provided about an internal semiconductor die 15 and a heat sink 17. As described below with reference to FIG. 2, housing 11 can include a first housing portion and second housing portion (only the second housing portion is visible in FIG. 1). In accordance with the presently described embodiment, semiconductor die 15 comprises synchronous-link dynamic random access memory circuitry. Semiconductor die 15 can be configured to provide additional and/or other functions.

A plurality of leads are coupled with one end of housing 11. In particular, the illustrated leads comprise plural first leads 14 coupled with the internal semiconductor die 15 and plural second leads 16 coupled with heat sink 17. First leads 14 are operable to provide electrical interconnection of semiconductor die 15 with external circuitry (not shown). Second leads 16 are operable to expel, dissipate or otherwise conduct heat generated within integrated circuit device 10 to external components, such as an externally provided heat sink (not shown). First leads 14 and second leads 16 are arranged to provide an integrated circuit device configuration which can be mounted in a vertical orientation.

Figure 2:
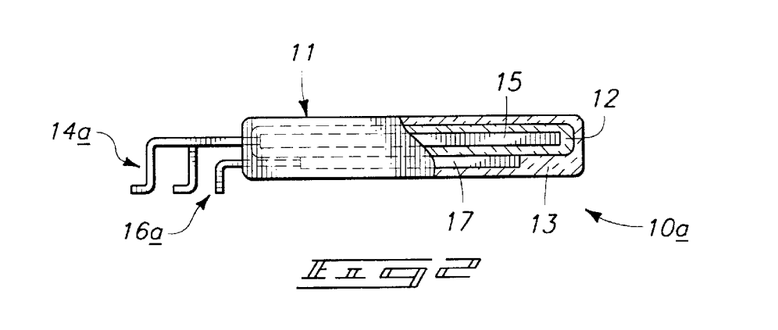
FIG. 2 is a side elevational view of a horizontal surface mounted package of the present invention.

Referring to FIG. 2, another configuration of integrated circuit device 10a is shown. Like numerals represent like components with any significant differences therebetween being represented by the suffix "a." Integrated circuit device 10a is configured as a horizontal surface mounted package. Similar to the vertical surface mounted package depicted in FIG. 1, integrated circuit device 10a is configured to house semiconductor die 15 and heat sink 17.

First and second leads 14a, 16a are bent or otherwise configured to provide horizontal mounting of integrated circuit device 10a. Leads 14a are configured to provide electrical connection with external electrical couplings (not shown). Second leads 16a are configured to provide coupling of internal heat sink 17 with an external thermal conductor (not shown).

Housing 11 can comprise the same housing configuration in both devices depicted in FIG. 1 and FIG. 2. The depicted housing 11 includes a first housing portion 12 and a second housing portion 13. First housing portion, also referred to as a first housing 12, is formed about semiconductor die 15 and at least a portion of first leads 14a. Second housing portion, also referred to as a second housing 13, is formed about at least a portion of heat sink 17 and at least a portion of second leads 16a.

More specifically, first housing 12 is configured to encapsulate or otherwise house semiconductor die 15 and at least a portion of first leads 14a in the illustrated embodiment. Second housing 13 is configured to encapsulate or otherwise house heat sink 17, first housing 12 and at least a portion of second leads 16. Second housing 13 also encapsulates at least a portion of first leads 14 in the depicted embodiment.

Referring to FIG. 3–FIG. 6, exemplary process steps for fabrication of first housing 12 are illustrated. Other and/or additional process steps can be utilized to fabricate first housing 12 of integrated device 10 in accordance with other fabrication methodologies.

Figure 3:
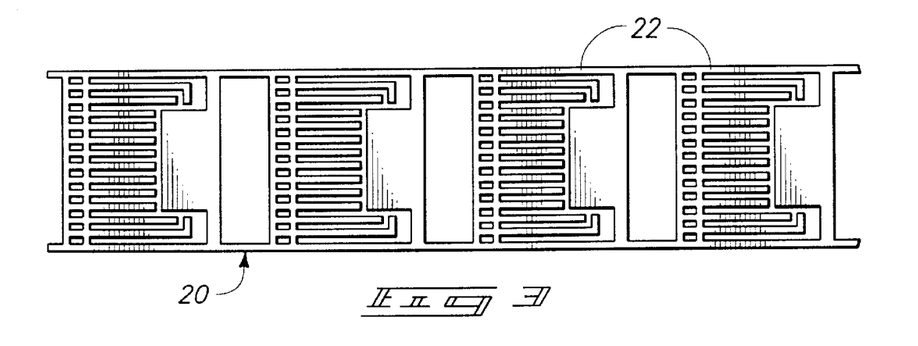
FIG. 3 is a top view of a strip of a plurality of first lead frames.

Referring specifically to FIG. 3, a lead frame strip 20 is diagrammatically and in broad outline illustrated. Lead frame strip 20 comprises a plurality of first lead frames 22 provided thereon. First lead frames 22 are individually configured to couple with and support a semiconductor die. First lead frames 22 can comprise a thin conductive metal such as copper. Lead frame strip 20 is utilized to simultaneously fabricate a plurality of integrated circuit devices.

Figure 4:
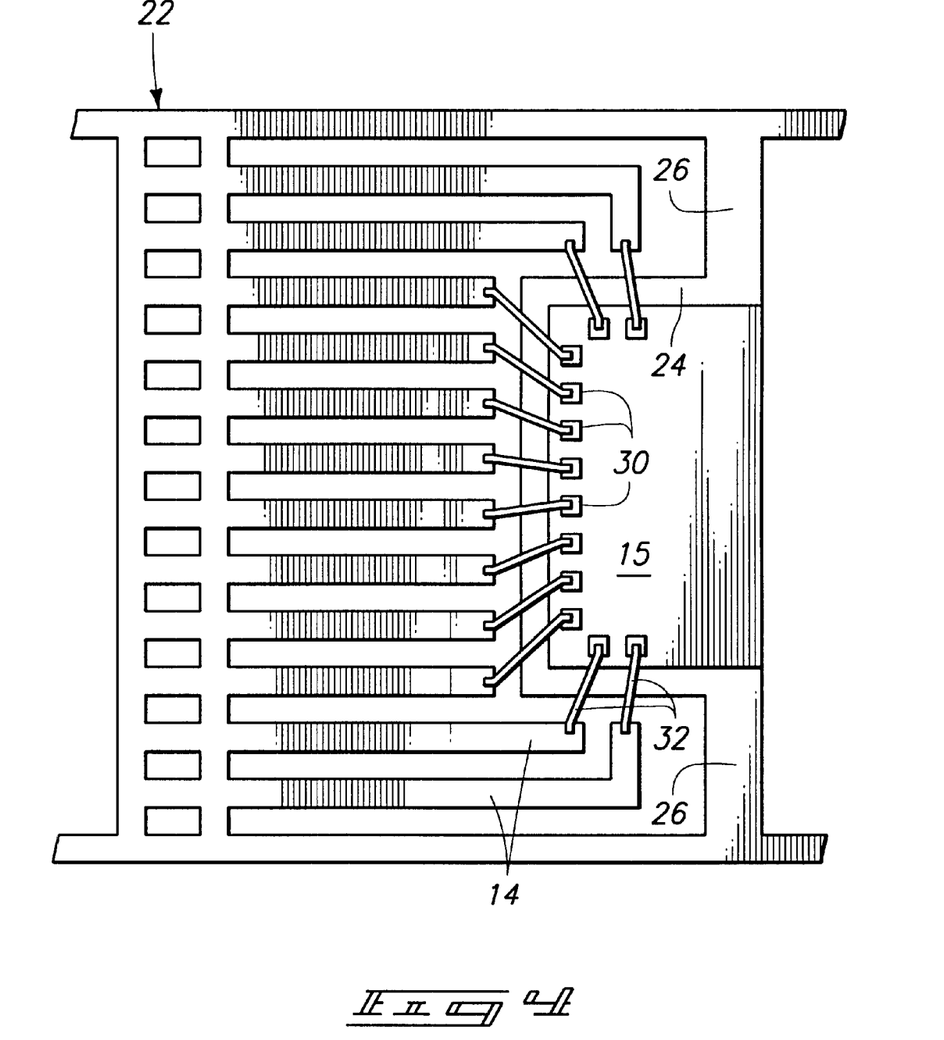
FIG. 4 is a top view illustrating details of one first lead frame of the strip of FIG. 3.

Referring to FIG. 4, details of an exemplary first lead frame 22 are illustrated. Semiconductor die 15 is illustrated coupled with first lead frame 22 in FIG. 4. In the described embodiment, first lead frame 22 includes plural first leads 14 operable to provide electrical connection with semiconductor die 15.

First lead frame 22 additionally includes a pad 24 configured to provide a mounting surface for semiconductor die 15 (a portion of pad 24 is provided below semiconductor die 15 and is not visible in the depicted arrangement). Semiconductor die 15 can be mechanically bonded to pad 24 using an epoxy. Other attachment methods of semiconductor die 15 can be utilized. Pad 24 is coupled with and supported by external portions of first lead frame 22 via plural lead frame supports 26.

The depicted semiconductor die 15 includes a plurality of bond pads 30. Following mechanical bonding or other coupling of semiconductor die 15 with pad 24 of first lead frame 22, wire bonding connections 32 are formed to couple individual bond pads 30 with corresponding first leads 14. Wire bonding connections 32 individually comprise gold in the described embodiment. Wire bonding connections 32 are operable to provide electrical coupling of first leads 14 with respective bond pads 30 and internal circuitry of semiconductor die 15. Alternative electrical connection methods of leads 14 and semiconductor die 15 are possible.

Figure 5:
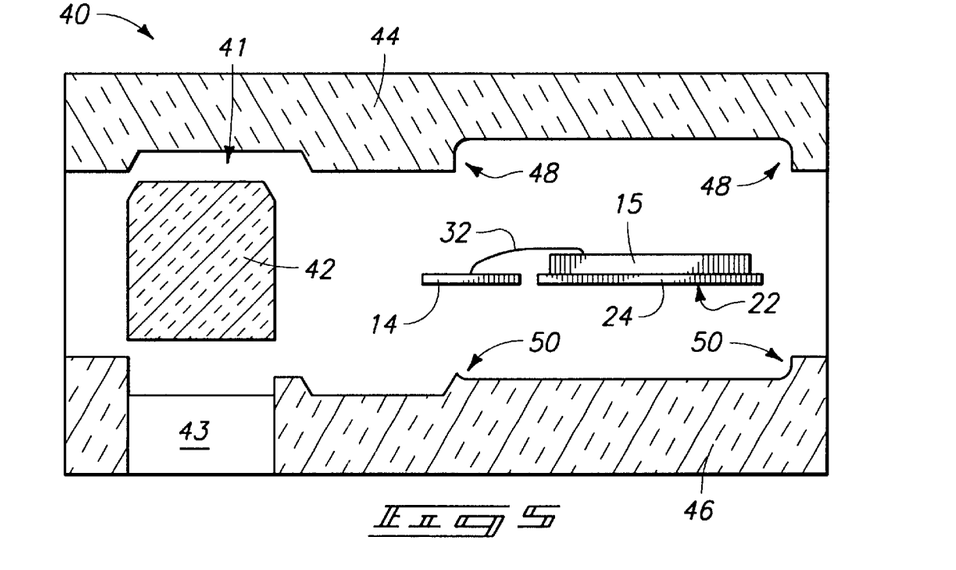
FIG. 5 is an illustrative representation of an exemplary fabrication step of an integrated circuit device.
Figure 6:
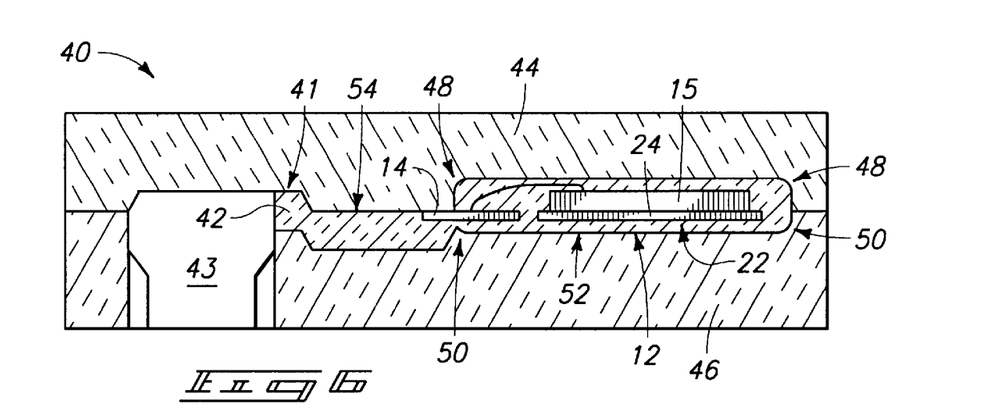
FIG. 6 is an illustrative representation of another exemplary processing step subsequent to the step shown in FIG. 5.

Referring to FIG. 5 and FIG. 6, additional exemplary fabrication steps of integrated circuit device 10 are described. As shown in FIG. 5, first lead frame 22 having semiconductor die 15 mounted thereon is placed within a mold 40. As illustrated, mold 40 comprises opposing first and second forms 44, 46. Mold 40 is configured in the described fabrication method to form first housing 12. In particular, first lead frame 22 comprising first leads 14 and pad 24 and semiconductor die 15 are provided intermediate opposing forms 44, 46 of mold 40. Forms 44, 46 include respective dams 48, 50. Lead frame 22 and semiconductor die 15 are preferably aligned with dams 48, 50 as shown in FIG. 5.

Mold 40 also provides a defined volume 41 intermediate forms 44, 46. A tablet of powdered resin 42 is placed within mold volume 41 and intermediate forms 44, 46. Resin 42 is inserted within volume 41 to provide material to form first housing 12 to house semiconductor die 15. A plunger 43 is positioned adjacent volume 41. Plunger 43 is operable to move upwardly to force resin 42 toward semiconductor die 15 and lead frame 22 positioned within mold 40.

Referring to FIG. 6, following placement of semiconductor die 15 and lead frame 22 within mold 40, forms 44, 46 are brought together. Respective dams 48, 50 define an inner chamber 52. Chamber 52 is configured to define the perimeter of first housing 12. Forms 44, 46 also define a runner 54 intermediate volume 41 and chamber 52. Volume 41 has been substantially filled with plunger 43 in FIG. 6. Runner 54 and chamber 52 have been substantially filed with resin 42 in FIG. 6.

Lead frame 22 and semiconductor die 15 are aligned within chamber 52 defined within mold 40. Following closure of forms 44, 46, mold 40 can be heated to an increased temperature, such as 1800 C. Heating of mold 40 results in melting of resin 42 within the tablet. Plunger 43 can be utilized to force the melted resin 42 through runner 54 into chamber 52. The melted resin 42 fills chamber 52 as shown. Thereafter, resin 42 is permitted to sufficiently solidify or otherwise cure within mold 40 to form first housing 12.

Figure 7:
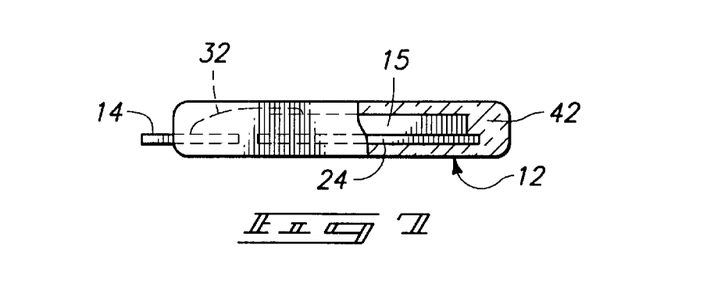
FIG. 7 is a side elevational view of an integrated circuit package at an intermediate processing step.

Referring to FIG. 7, first housing 12 and the first lead frame (not 4 shown in FIG. 7) are removed from the mold following sufficient solidification of resin 42. As shown, resin 42 encapsulates semiconductor die 15, lead frame pad 24, wire bonding connections 32, and a portion of first leads 14. Unencapsulated portions of first leads 14 are exposed outside of first housing 12.

First housing 12 can be removed from the first lead frame following removal of first housing 12 and the first lead frame from mold 40. In particular, pad connections 26 (shown in FIG. 4) are broken to remove first housing 12. Thereafter, first housing 12 can undergo further processing to form the desired integrated circuit device 10.

Figure 8:
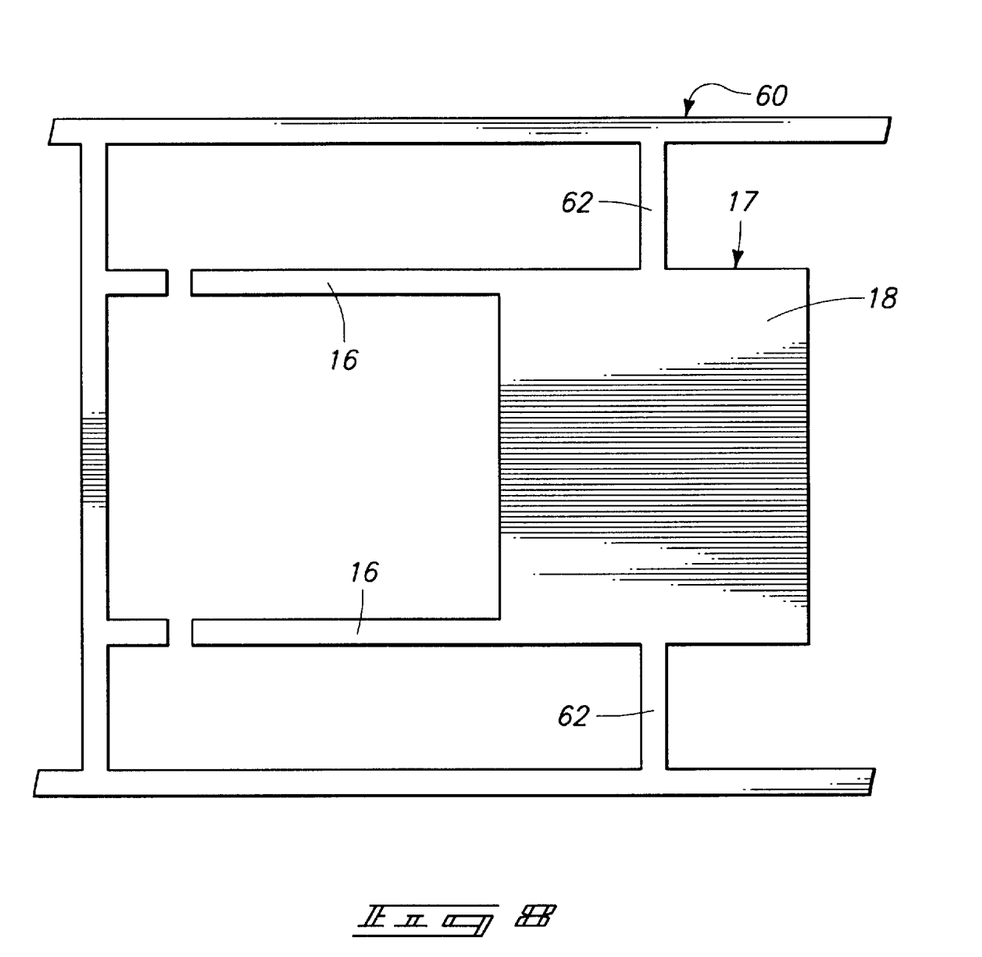
FIG. 8 is a top view of a second lead frame.

Referring to FIG. 8, a second lead frame 60 is illustrated. Second lead frame 60 includes heat sink 17. Second lead frame 60 is formed of a thermally conductive material such as a metal in the described embodiment. Heat sink 17 includes a body 18. Heat sink body 18 is supported by plural supports 62. The illustrated heat sink 17 includes plural second leads 16 coupled with heat sink body 18. Second lead frame 60 is typically provided within a lead frame strip (not shown) similar to first lead frame strip 20 shown in FIG. 3. Such a strip could include a plurality of heat sinks 17 corresponding to the number of first lead frames 22 provided.

Figure 9:
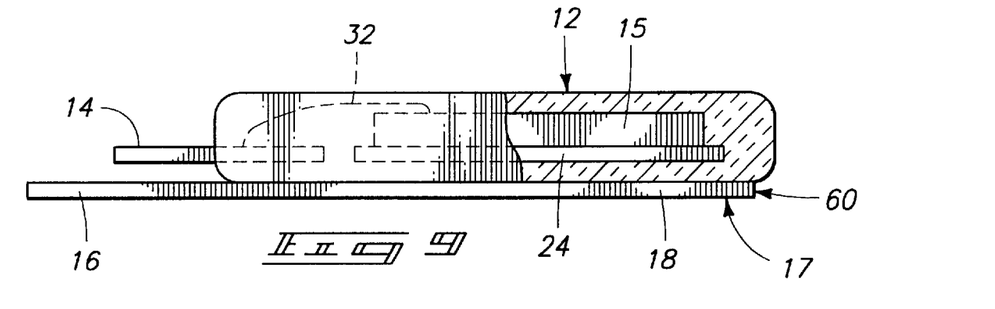
FIG. 9 is a side elevational view of a heat sink of the second lead frame positioned adjacent a first housing.

Referring to FIG. 9, following sufficient solidification of first housing 12 and removal thereof from the first mold and the first lead frame, heat sink 17 of second lead frame 60 is thermally coupled with first housing 12. In the described embodiment, heat sink 17 is positioned proximate or adjacent first housing 12. In the preferred embodiment, heat sink 17 is positioned against or in contacting relation with first housing 12. Heat sink 17 is configured to draw heat generated from semiconductor die 15 and preferably expel or dissipate the heat.

The second housing of the integrated circuit device is thereafter formed. Although not illustrated, the method of forming the first housing can be utilized to form the second housing. Such can be referred to as a "double molding" process. More specifically, following the positioning of heat sink 17 against first housing 12, or other is suitable thermal coupling, second lead frame 60 and first housing 12 are provided within a second mold. Such a mold contains appropriate forms having dams to define a second chamber for forming the second housing of the integrated circuit device.

A resin tablet is inserted into the second mold and first housing 12 and second lead frame 60 are placed within the appropriate second chamber formed within the second mold. The second mold is subsequently heated to a sufficient elevated temperature to melt the resin. Thereafter, a plunger is utilized to force the melted resin into the second chamber containing first housing 12 and second lead frame 60.

The resin is thereafter permitted to sufficiently solidify to form the second housing. First and second housings 12, 13 (shown in FIG. 10) are removed from the mold following such solidification. Second housing 13 is then removed from second lead frame 60 by breaking connections 62 (shown in FIG. 8). Connections 62 are broken to free heat sink 17 and second housing 13 from lead frame 60.

Figure 10:
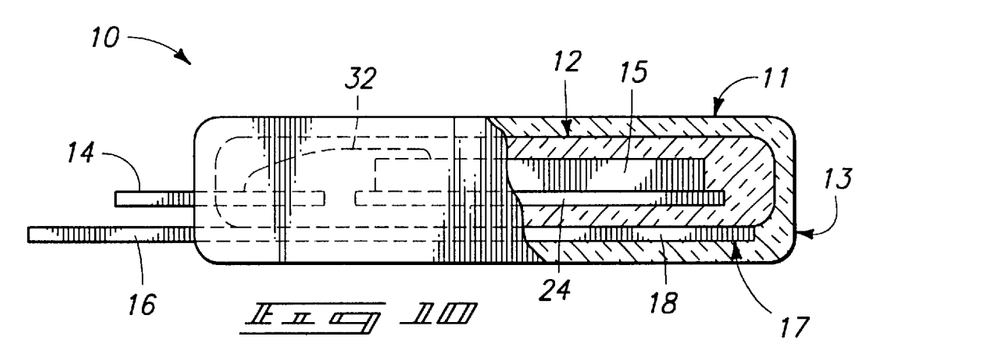
FIG. 10 is a side elevational view of an integrated circuit device according to a first embodiment of the present invention.
Figure 11:
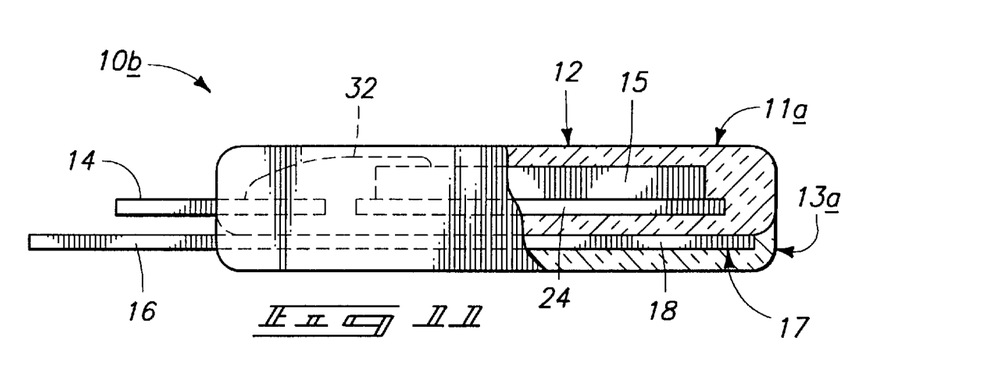
FIG. 11 is a side elevational view of an integrated circuit device according to a second embodiment of the present invention.

Referring to FIG. 10 and FIG. 11, plural housing configurations 11, 11a of respective integrated circuit device configurations 10, 10b are illustrated. FIG. 10 and FIG. 11 individually illustrate respective integrated circuit devices 10, 10b at a step following the removal of devices 10, 10b from the second lead frame. Devices 10, 10b are depicted at a step prior to final fabrication steps comprising bending and trimming of first leads 14 and second leads 16 which extend from the illustrated housings 11, 11a.

Referring specifically to FIG. 10, the first configuration of housing 11 is shown. First housing 12 of housing 11 is formed about semiconductor die 15 and at least portions of leads 14 coupled with semiconductor die 15. Second housing 13 is formed about at least a portion of first housing 12, at least a portion of first leads 14 and at least a portion of heat sink 17.

In particular, first housing 12 and second housing 13 individually comprise encapsulant housings in the configuration shown in FIG. 10. More specifically, first housing 12 encapsulates semiconductor die 15 and at least a portion of first leads 14. Second housing 13 encapsulates a majority of heat sink 17 and a majority of first housing 12. More specifically, second housing 13 encapsulates first housing 12, heat sink body 18, and at least a portion of first leads 14 and second leads 16.

Referring specifically to FIG. 11, another configuration of housing 11a of integrated circuit device 10b is illustrated. In the depicted configuration, first housing 12 encapsulates semiconductor die 15 and a portion of first leads 14. Second housing 13a is shown provided about at least a portion of heat sink 17 and first housing 12. In particular, second housing 13a is shown encapsulating three surfaces of heat sink body 18 and a portion of first housing 12 in the configuration depicted in FIG. 11.

Other housing configurations of integrated circuit device 10 can be formed according to the present invention. First housing 12 can be provided about or configured to encapsulate more or less components of integrated circuit device 10. Further, more or less portions of first housing 12 and heat sink 17 can be encapsulated or otherwise covered by second housing 13.

External exposed portions of first leads 14 and second leads 16 can be trimmed and/or bent into appropriate positions to provide the desired integrated circuit device 10, 10a forming a vertical surface mounted package or a horizontal surface mounted package as depicted in FIG. 1 and FIG. 2, respectively.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An integrated circuit device comprising:
a semiconductor die comprising synchronous-link dynamic random access memory circuitry;
a first housing encapsulating the semiconductor die;
a heat sink positioned proximate to the first housing; and
a second housing encapsulating at least a portion of the heat sink.

2. The integrated circuit device according to claim 1 further comprising at least one first lead coupled with the semiconductor die and the first housing encapsulates at least a portion of the at least one first lead.

3. The integrated circuit device according to claim 1 wherein the heat sink comprises:
a body; and
at least one second lead coupled with the body and the second housing encapsulates at least a portion of the at least one second lead.

4. The integrated circuit device according to claim 3 wherein the at least one second lead is configured to dissipate heat from the semiconductor die externally of the second housing.

5. The integrated circuit device according to claim 1 wherein the second housing encapsulates substantially the entire heat sink.

6. The integrated circuit device according to claim 1 wherein the second housing encapsulates substantially the entire heat sink and at least a portion of the first housing.

7. The integrated circuit device according to claim 1 wherein the second housing encapsulates substantially the entire heat sink and a majority of the first housing.

8. The integrated circuit device according to claim 1 wherein the semiconductor die comprises a synchronous-link dynamic random access memory device and the second housing forms one of a vertical is surface mounted package and a horizontal surface mounted package.

9. An integrated circuit device comprising:
a semiconductor die having a plurality of bond pads;
a plurality of leads electrically coupled with the bond pads of the semiconductor die;
a first housing encapsulating the semiconductor die and at least a portion of the leads;
a heat sink thermally coupled with the first housing; and
a second housing encapsulating at least a portion of the heat sink providing another portion of the heat sink external of the second housing.

10. The integrated circuit device according to claim 9 wherein the heat sink comprises a metal and the first housing contacts the metal.

11. The integrated circuit device according to claim 9 wherein the another portion of the heat sink comprises at least one lead configured to dissipate heat from the semiconductor die.

12. The integrated circuit device according to claim 9 wherein the second housing forms one of a vertical surface mounted package and a horizontal surface mounted package.

13. The integrated circuit device according to claim 9 wherein the second housing encapsulates the first housing.

14. An integrated circuit device comprising:
a first housing formed about a semiconductor die and at least portions of a plurality of leads electrically coupled with the semiconductor die;
a heat sink thermally coupled with the first housing;
a second housing formed about the heat sink and at least a portion of the first housing; and
wherein the first and second housings are configured such that the heat sink dissipates heat externally of the first and the second housings.

15. The integrated circuit device according to claim 14 wherein the first housing and second housing individually comprise an encapsulant housing.

16. The integrated circuit device according to claim 14 wherein the heat sink contacts the first housing.

17. The integrated circuit device according to claim 14 wherein the heat sink dissipates heat externally of the first and the second housings comprises at least one lead external of the first and the second housings.

18. A synchronous-link dynamic random access memory device comprising:
a semiconductor die bearing synchronous-link dynamic random access memory circuitry and having a plurality of bond pads coupled therewith;
a plurality of leads electrically coupled with the bond pads of the semiconductor die;
a first housing encapsulating the semiconductor die and at least a portion of the leads;
a heat sink positioned proximate the first housing and configured to draw heat from the semiconductor die; and
a second housing encapsulating the heat sink and at least a portion of the first housing.

19. The synchronous-link dynamic random access memory device according to claim 18 wherein the second housing forms one of a vertical surface mounted package and a horizontal surface mounted package.

20. The synchronous-link dynamic random access memory device according to claim 18 wherein the heat sink comprises at least one lead configured to dissipate heat from the semiconductor die.

21. The integrated circuit device according to claim 1 wherein the second housing encapsulates substantially an entirety of the heat sink and the heat sink comprises a lead configured to dissipate heat externally of the second housing.

22. The integrated circuit device according to claim 9 wherein the second housing encapsulates substantially an entirety of the heat sink.

23. The integrated circuit device according to claim 9 wherein the second housing encapsulates substantially an entirety of the heat sink and the heat sink comprises a lead configured to dissipate heat externally of the second housing.

24. The integrated circuit device according to claim 14 wherein the second housing encapsulates substantially the entirety of the heat sink.

25. The integrated circuit device according to claim 14 wherein a combination of both the first housing and the second housing encapsulate substantially an entirety of the heat sink.

26. The integrated circuit device according to claim 14 wherein the second housing encapsulates substantially an entirety of a body of the heat sink and the heat sink comprises a lead configured to dissipate heat externally of the second housing.

27. An integrated circuit device comprising:
a semiconductor die;
a first housing encapsulating the semiconductor die;

a heat sink positioned proximate to the first housing; and a second housing encapsulating at least a portion of the heat sink, wherein the heat sink comprises a body and at least one second lead coupled with the body, and the second housing encapsulates at least a portion of the at least one second lead.

28. The integrated circuit device according to claim 27 wherein the at least one second lead is configured to dissipate heat from the semiconductor die externally of the second housing.

29. An integrated circuit device comprising:

a semiconductor die;

a first housing encapsulating the semiconductor die;

a heat sink positioned proximate to the first housing;

a second housing encapsulating at least a portion of the heat sink; and wherein the second housing encapsulates substantially the entire heat sink.

30. An integrated circuit device comprising:

a semiconductor die;

a first housing encapsulating the semiconductor die;

a heat sink positioned proximate to the first housing;

a second housing encapsulating at least a portion of the heat sink; and wherein the second housing encapsulates substantially the entire heat sink and at least a portion of the first housing.

31. An integrated circuit device comprising:

a semiconductor die;

a first housing encapsulating the semiconductor die;

a heat sink positioned proximate to the first housing;

a second housing encapsulating at least a portion of the heat sink; and wherein the second housing encapsulates substantially the entire heat sink and a majority of the first housing.

32. An integrated circuit device comprising:

a semiconductor die;

a first housing encapsulating the semiconductor die;

a heat sink positioned proximate to the first housing;

a second housing encapsulating at least a portion of the heat sink; and wherein the semiconductor die comprises a synchronous-link dynamic random access memory device and the second housing forms one of a vertical surface mounted package and a horizontal surface mounted package.

33. An integrated circuit device comprising:

a semiconductor die;

a first housing encapsulating the semiconductor die;

a heat sink positioned proximate to the first housing;

a second housing encapsulating at least a portion of the heat sink; and wherein the second housing encapsulates substantially an entirety of the heat sink and the heat sink comprises a lead configured to dissipate heat externally of the second housing.

34. An integrated circuit device comprising:

a semiconductor die having a plurality of bond pads;

a plurality of leads electrically coupled with the bond pads of the semiconductor die;

a first housing encapsulating the semiconductor die and at least a portion of the leads;

a heat sink thermally coupled with the first housing;

a second housing encapsulating at least a portion of the heat sink; and wherein the heat sink includes at least one lead configured to dissipate heat from the semiconductor die.

35. An integrated circuit device comprising:

a semiconductor die having a plurality of bond pads;

a plurality of leads electrically coupled with the bond pads of the semiconductor die;

a first housing encapsulating the semiconductor die and at least a portion of the leads;

a heat sink thermally coupled with the first housing;

a second housing encapsulating at least a portion of the heat sink; and wherein the second housing forms one of a vertical surface mounted package and a horizontal surface mounted package.

36. An integrated circuit device comprising:

a semiconductor die having a plurality of bond pads;

a plurality of leads electrically coupled with the bond pads of the semiconductor die;

a first housing encapsulating the semiconductor die and at least a portion of the leads;

a heat sink thermally coupled with the first housing;

a second housing encapsulating at least a portion of the heat sink; and wherein the second housing encapsulates substantially an entirety of the heat sink and the heat sink comprises a lead configured to dissipate heat externally of the second housing.

37. An integrated circuit device comprising:

a first housing formed about a semiconductor die and at least portions of a plurality of leads electrically coupled with the semiconductor die;

a heat sink thermally coupled with the first housing; and a second housing formed about the heat sink and at least a portion of the first housing;

wherein substantially an entirety of the heat sink is encapsulated by at least one of the first housing and the second housing; and wherein the heat sink further includes at least one lead configured to dissipate heat from the semiconductor die.

38. An integrated circuit device comprising:

a first housing formed about a semiconductor die and at least portions of a plurality of leads electrically coupled with the semiconductor die;

a heat sink thermally coupled with the first housing; and a second housing formed about the heat sink and at least a portion of the first housing;

wherein substantially an entirety of the heat sink is encapsulated by at least one of the first housing and the second housing; and wherein the second housing encapsulates substantially an entirety of a body of the heat sink and the heat sink comprises a lead configured to dissipate heat externally of the second housing.

39. An integrated circuit device comprising:

a semiconductor die;

a housing configured to encapsulate at least a portion of the semiconductor die; and a heat sink configured to dissipate heat from the semiconductor die externally of the housing.

* * * * *

UNITED STATES PATENT AND TRADEMARK OFFICE
CERTIFICATE OF CORRECTION

PATENT NO.    : 6,355,985 B1
DATED         : March 12, 2002
INVENTOR(S)   : Joseph M. Brand It is certified that error appears in the above-identified patent and that said Letters Patent is hereby corrected as shown below:

Column 5,
Line 29, replace "frame (not 4 shown in FIG. 7)" with -- frame (not shown in Fig. 7) --

Column 7,
Line 43, replace "forms one of a vertical is surface mounted" with -- forms one of a vertical surface mounted --

Signed and Sealed this

Twentieth Day of August, 2002

Attest:

Attesting Officer

JAMES E. ROGAN
*Director of the United States Patent and Trademark Office*